(12) United States Patent
Amstatt

(10) Patent No.: US 9,899,566 B2
(45) Date of Patent: Feb. 20, 2018

(54) OPTOELECTRONIC DEVICE COMPRISING MICROWIRES OR NANOWIRES

(71) Applicant: ALEDIA, Grenoble (FR)

(72) Inventor: Benoît Amstatt, Grenoble (FR)

(73) Assignee: ALEDIA, Grenoble (FR)

( * ) Notice: Subject to any disclaimer, the term of this patent is extended or adjusted under 35 U.S.C. 154(b) by 36 days.

(21) Appl. No.: 14/758,197

(22) PCT Filed: Dec. 27, 2013

(86) PCT No.: PCT/FR2013/053272
§ 371 (c)(1),
(2) Date: Jun. 26, 2015

(87) PCT Pub. No.: WO2014/102512
PCT Pub. Date: Jul. 3, 2014

(65) Prior Publication Data
US 2015/0340552 A1    Nov. 26, 2015

(30) Foreign Application Priority Data

Dec. 28, 2012  (FR) ...................................... 12 62927
Dec. 28, 2012  (FR) ...................................... 12 62929

(51) Int. Cl.
*H01L 31/0352* (2006.01)
*H01L 33/06* (2010.01)
(Continued)

(52) U.S. Cl.
CPC ........ *H01L 33/06* (2013.01); *H01L 31/03044* (2013.01); *H01L 31/035227* (2013.01); *H01L 31/035236* (2013.01); *H01L 31/035281* (2013.01); *H01L 31/0735* (2013.01); *H01L 31/109* (2013.01); *H01L 31/1848* (2013.01);
(Continued)

(58) Field of Classification Search
CPC ......... H01L 29/0676; H01L 31/035227; H01L 31/035281; H01L 33/08; H01L 33/24; B82Y 10/00
See application file for complete search history.

(56) References Cited

U.S. PATENT DOCUMENTS 7,829,443 B2    11/2010  Siefert et al.
2008/0149944 A1  6/2008  Samuelson et al.
(Continued)

FOREIGN PATENT DOCUMENTS

DE  10 2010 012711 A1   9/2011
EP     2 333 847 A1     6/2011
(Continued)

OTHER PUBLICATIONS

Anjia Gu, et al., "Design and Growth of III-V Nanowire Solar Cell Arrays on Low Cost Substrates", 35th IEEE Photovoltaic Specialists Conference (PVSC), Jun. 20-25, 2010.
(Continued)

*Primary Examiner* — Davienne Monbleau
*Assistant Examiner* — Leslie Pilar Cruz
(74) *Attorney, Agent, or Firm* — Howard IP Law Group

(57) ABSTRACT

The invention relates to an optoelectronic device comprising microwires or nanowires, each having at least one active portion (34, 39) between two insulated portions (32, 36, 40), the active portion having inclined flanks or having a diameter different from the diameter of at least one of the two insulated portions.

22 Claims, 2 Drawing Sheets

(51) Int. Cl.
- *H01L 33/00* (2010.01)
- *H01L 33/32* (2010.01)
- *H01L 31/0304* (2006.01)
- *H01L 31/109* (2006.01)
- *H01L 33/08* (2010.01)
- *H01L 33/18* (2010.01)
- *H01L 33/24* (2010.01)
- *H01L 31/0735* (2012.01)
- *H01L 31/18* (2006.01)

(52) U.S. Cl.
CPC ...... *H01L 33/0025* (2013.01); *H01L 33/0075* (2013.01); *H01L 33/08* (2013.01); *H01L 33/18* (2013.01); *H01L 33/24* (2013.01); *H01L 33/32* (2013.01); *Y02E 10/544* (2013.01); *Y02P 70/521* (2015.11)

(56) References Cited

U.S. PATENT DOCUMENTS

| | | |
|---|---|---|
| 2011/0309382 A1 | 12/2011 | Löwgren |
| 2012/0068153 A1 | 3/2012 | Seong et al. |
| 2012/0217474 A1 | 8/2012 | Zang et al. |
| 2014/0077156 A1 | 3/2014 | Bavencove et al. |

FOREIGN PATENT DOCUMENTS

| | | |
|---|---|---|
| WO | 2010/005381 A1 | 1/2010 |
| WO | 2012/054477 A2 | 4/2012 |
| WO | 2012/156620 A2 | 11/2012 |

OTHER PUBLICATIONS

International Search Report for Counterpart Application PCT/FR2013/053272 dated Apr. 14, 2014.

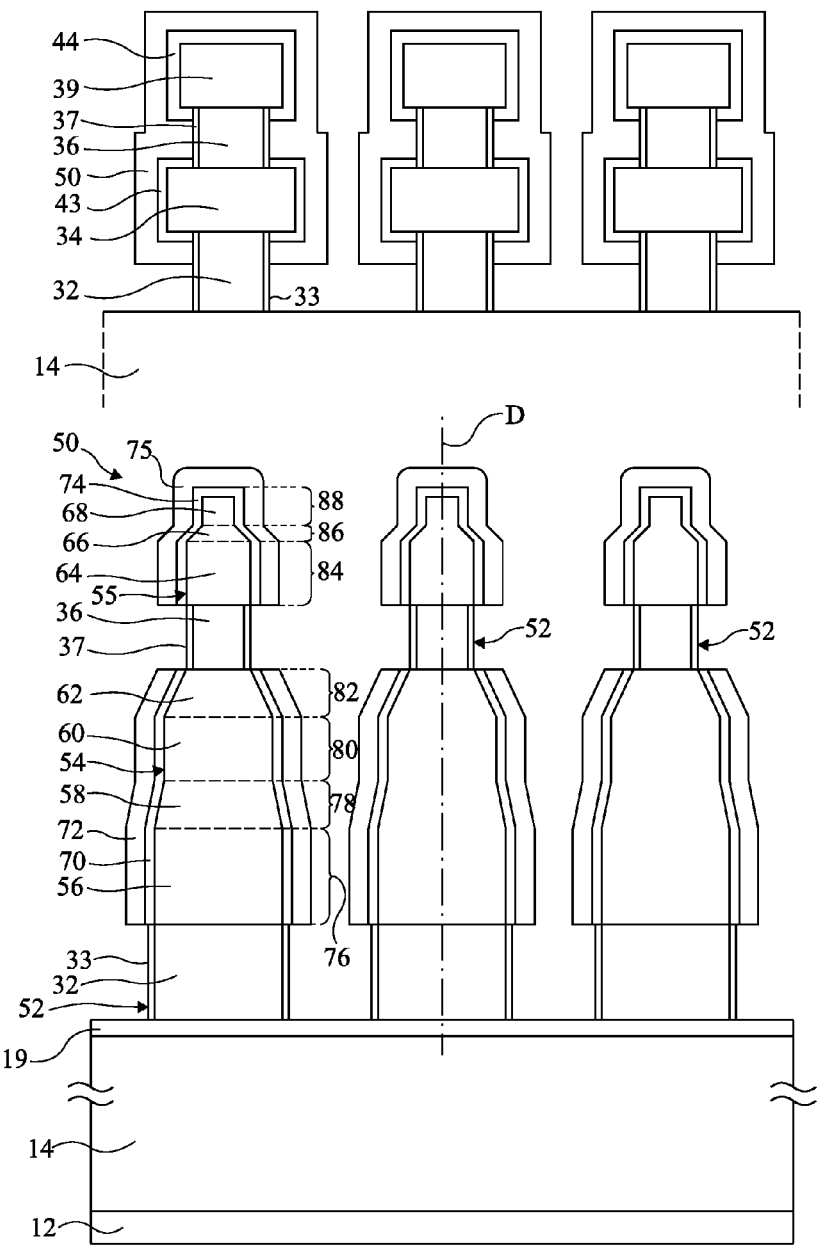
Fig 3
Fig 4
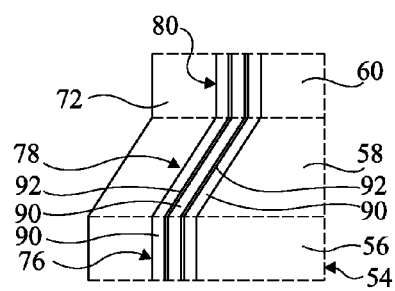
Fig 5

OPTOELECTRONIC DEVICE COMPRISING MICROWIRES OR NANOWIRES

CROSS REFERENCE TO RELATED APPLICATIONS

The present patent application is the national stage application under 35 U.S.C. §371 of International Application No. PCT/FR2013/053272 filed Dec. 27, 2013 with priority claim to French patent application Nos. FR12/62927 and FR12/62929 filed Dec. 28, 2012, the entire disclosures of which are incorporated herein by reference in their entireties.

BACKGROUND

The present disclosure generally relates to optoelectronic devices comprising semiconductor microwires or nanowires and to methods for manufacturing the same.

Term "optoelectronic devices" is used to designate devices capable of converting an electric signal into an electromagnetic radiation or the other way, and especially devices dedicated to detecting, measuring, or emitting an electromagnetic radiation or devices dedicated to photovoltaic applications.

DISCUSSION OF THE RELATED ART

The improvement of optoelectronic devices with microwires or nanowires of radial type comprising an active area formed at the periphery of a microwire or nanowire, is here more specifically considered.

The microwires or nanowires considered herein comprise a semiconductor material mainly comprising a group-III element and a group-V element (for example, gallium nitride GaN), called III-V compound hereafter.

Such devices are for example described in unpublished French patent application No. 12/58729 filed on Sep. 18, 2012.

SUMMARY

Thus, an optoelectronic device comprising microwires or nanowires, each of which comprises at least one active portion between two insulated portions, is provided herein, the active portion being surrounded with an active layer, the active portion having sides which are inclined or comprise at least a portion having a diameter different from the diameter of at least one of the two insulated portions.

According to an embodiment, the active portion comprises at least a first portion extending in a second portion, the first portion being the closest to the support of the microwires or nanowires, the first and second portions having straight sides and different diameters, the first and second portions having inclined sides with different inclinations, the first portion having inclined sides and the second portion having straight sides, or the first portion having straight sides and the second portion having inclined sides.

According to an embodiment, the portion of the active layer surrounding the first active portion and the portion of the active layer surrounding the second active portion are capable of emitting or of capturing light at different wavelengths.

According to an embodiment, the first or the second portion has inclined sides and has a cross-section which decreases as the distance to the support of the microwires or nanowires increases.

According to an embodiment, the first or the second portion has inclined sides and has a cross-section which increases as the distance the support of the microwires or nanowires increases.

According to an embodiment, each microwire or nanowire comprises a third portion continuing the second portion, the third portion having straight sides or inclined sides.

According to an embodiment, the device comprises an alternation of insulated portions and of active portions, each active portion having inclined sides or comprising at least a portion having a diameter different from the diameter of at least one of the two insulated portions.

According to an embodiment, the device comprises an alternation of insulated portions and of active portions, the different active portions having different diameters.

According to an embodiment, each active layer is surrounded with an electrode layer.

According to an embodiment, at least two active portions have sides oriented according to different crystal planes.

According to an embodiment, the active layers surrounding at least two active portions are capable of emitting or of capturing light at different wavelengths.

According to an embodiment, each active layer comprises a multiple quantum well structure.

According to an embodiment, the insulated portions and the active portions mainly comprise a III-V compound.

According to an embodiment, the III-V compound is a III-N compound, particularly selected from the group comprising gallium nitride, aluminum nitride, indium nitride, indium gallium nitride, aluminum gallium nitride, and indium aluminum gallium nitride.

According to an embodiment, each insulated portion is surrounded with a layer of dielectric material having a thickness in the range from one atomic monolayer to 10 nm.

According to an embodiment, the total height of each portion of each microwire or nanowire is greater than or equal to 500 nm.

According to an embodiment, the portion most distant from the support is an insulated portion.

A method of manufacturing an optoelectronic device such as previously described is also provided, wherein the insulated portions are formed in a reactor with first proportions of precursors of III-V compounds and a dopant such as silicon, and wherein the active portion is formed in the same reactor in different operating conditions with a dopant rate smaller than that of the insulated portions or equal to zero.

According to an embodiment, the active portion is formed with lower operating pressures than the insulated portions.

According to an embodiment, the active portion is formed with proportions of precursors of the III-V compounds different from those of the insulated portions.

According to an embodiment, the first portion is formed in a reactor with first operating conditions of the reactor, and the second portion is formed in the same reactor with second operating conditions different from the first operating conditions.

According to an embodiment, the first and second portions mainly comprise a III-V compound and the first or the second portion is formed by increasing or decreasing the ratio of proportions of precursors of the III-V compounds with a variation rate which is constant to within 10%.

According to an embodiment, the first and second portions mainly comprise a III-V compound and the first portion is formed with a first ratio of proportions of precursors of the III-V compounds at a first value which is constant to within 10% and the second portion is formed with a second ratio of proportions of precursors of the III-V compounds which is constant to within 10% and different from the first ratio.

According to an embodiment, the first or the second portion is formed by increasing or decreasing the pressure in the reactor with a variation rate which is constant to within 10%.

According to an embodiment, the first portion is formed with a first pressure in the reactor which is constant to within 10% and the second portion is formed with a second pressure in the reactor which is constant to within 10% and different from the first pressure.

BRIEF DESCRIPTION OF THE DRAWINGS

The foregoing and other features and advantages will be discussed in detail in the following non-limiting description of specific embodiments in connection with the accompanying drawings, among which:

FIG. 3 is a partial simplified cross-section view of an alternative embodiment of an optoelectronic device with microwires or nanowires;

FIG. 4 is a partial simplified cross-section view of another embodiment of an optoelectronic device with microwires or nanowires; and FIG. 5 is an enlarged view of a portion of FIG. 4.

DETAILED DESCRIPTION

Figure 1:
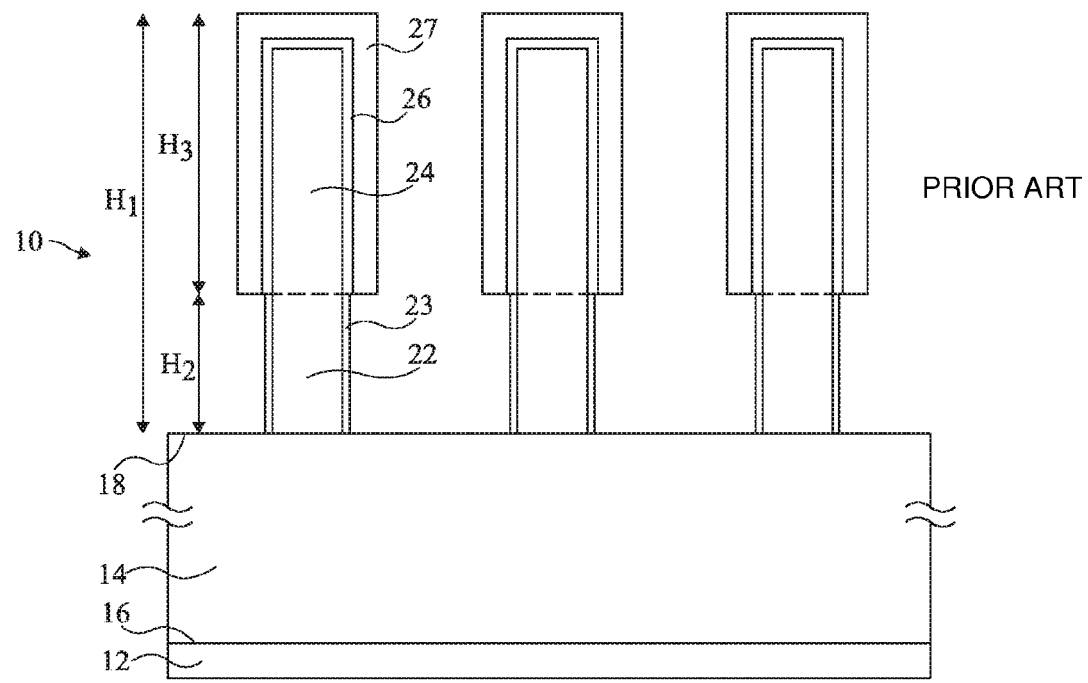
FIG. 1 is a partial simplified cross-section view of an optoelectronic device with microwires or nanowires.

For clarity, the same elements have been designated with the same reference numerals in the various drawings and, further, as usual in the representation of electronic circuits, the various drawings are not to scale. Further, only those elements which are useful to the understanding of the present description have been shown and will be described. In particular, the optoelectronic device control means described hereafter are within the abilities of those skilled in the art and are not described.

In the following description, unless otherwise indicated, terms "substantially", "approximately", and "in the order of" mean "to within 10%". Further, "compound mainly formed of a material" or "compound based on a material" means that a compound comprises a proportion greater than or equal to 95% of said material, this proportion being preferably greater than 99%.

Term "microwire" or "nanowire" designates a three-dimensional structure having an elongated shape, having at least two dimensions, called minor dimensions, in the range from 5 nm to 2.5 µm, preferably from 50 nm to 2.5 µm, the third dimension, called major dimension, being at least equal to 1 time the largest of the minor dimensions, preferably at least 5 times, and more preferably still at least 10 times. In certain embodiments, the minor dimensions may be smaller than or equal to approximately 1,000 nm, preferably in the range from 100 nm to 300 nm. In certain embodiments, the height of each microwire or nanowire may be greater than or equal to 500 nm, preferably in the range from 1 µm to 50 µm.

The cross-section of the microwires or nanowires may have different shapes, such as, for example, a shape which may be oval, circular, or polygonal, particularly triangular, rectangular, square, or hexagonal. It should thus be understood that term "diameter" of a microwire or nanowire or of a layer deposited on this microwire or nanowire designates a quantity associated with the perimeter of the targeted structure, corresponding, for example, to the diameter of the disk having the same surface area as the wire cross-section.

The microwires or nanowires may be at least partly formed from semiconductor materials mainly comprising a III-V compound, for example, III-N compounds. Examples of group-III elements comprise gallium (Ga), indium (In), or aluminum (Al). Examples of III-N compounds are GaN, AlN, InN, InGaN, AlGaN, or AlInGaN. Other group-V elements may also be used, for example, phosphorus or arsenic. Generally, the elements in the III-V compound may be combined with different molar fractions.

In certain embodiments, the microwires or nanowires may comprise a dopant from the group comprising a group-II P-type dopant, for example, magnesium (Mg), zinc (Zn), cadmium (Cd), or mercury (Hg), a group-IV P-type dopant, for example, carbon (C), or a group-IV N-type dopant comprising, for example, silicon (Si), germanium (Ge), selenium (Se), sulfur (S), terbium (Tb), and tin (Sn).

The microwires or nanowires are formed on a surface of a substrate. The substrate may correspond to a one-piece structure or correspond to a layer covering a support made of another material. The substrate for example is a semiconductor substrate such as a substrate made of silicon, germanium, silicon carbide, a III-V compound, such as GaN or GaAs, or a ZnO substrate. The substrate may be made of a conductive material, for example, of metal, or of an insulating material, for example, of sapphire, glass, or ceramic.

A treatment may be applied to the substrate to promote the microwire or nanowire growth, particularly at determined locations. An example of treatment comprises covering the substrate with a layer, called nucleation layer, of a material promoting the growth of microwires or nanowires. Another example of treatment comprises depositing on the substrate or on the nucleation layer a layer of a dielectric material, forming openings in the layer of dielectric material to expose portions of the substrate or of the nucleation layer, and growing microwires or nanowires on the exposed portions of the substrate or nucleation layer, as described in document U.S. Pat. No. 7,829,443. Another example of treatment comprises depositing on the substrate a layer comprising portions of a material, each promoting the growth of a microwire or nanowire of a III-V compound according to the polarity of the group-V element separated by a region of a material promoting the growth of the III-V compound according to the polarity of the group-III element, as described in unpublished patent application No. 12/58729. Another example of treatment comprises forming, on the substrate, pads of a material promoting the growth of microwires or nanowires and performing a treatment for protecting the portions of the surface of the substrate which are not covered with the pads to prevent the growth of microwires or nanowires, as described in unpublished patent application No. 12/60232.

The microwire or nanowire growth method may be a method such as metal-organic chemical vapor deposition (MOCVD), also known as organo-metallic vapor phase epitaxy (OMVPE). However, methods such as molecular-beam epitaxy (MBE), gas-source MBE (GSMBE), metal-organic MBE (MOMBE), atomic layer epitaxy (ALE), or hybrid vapor phase epitaxy (HVPE) may be used.

As an example, the method may comprise injecting into a reactor a precursor of a group-III element and a precursor of a group-V element. Examples of precursors of group-III elements are trimethylgallium (TMGa), triethylgallium (TEGa), trimethylindium (TMIn), or trimethylaluminum (TMAl). Examples of precursors of group-V elements are ammonia ($NH_3$), tertiarybutylphosphine (TBP) or arsine ($AsH_3$).

A precursor of an additional element may be added to the precursors of the III-V compound. The additional element may be silicon (Si). An example of a precursor of silicon is silane ($SiH_4$). The presence of the precursor of the additional element results in incorporating the additional element into the III-V compound to dope this III-V compound, but also in forming a layer of a dielectric material mainly formed of the additional element and the group-V element on the lateral sides of the growing crystals of the III-V compound. The concentration of the additional element in the III-V compound is in the range from $10^{18}$ to $10^{21}$ atoms/$cm^3$. The layer of dielectric material has a thickness in the range from one atom monolayer to 10 nm. In the case where the III-V compound is GaN and the additional element is silicon, the GaN is N-type doped and will here be called $n^+$GaN and the layer of dielectric material is silicon nitride SiN, possibly in stoichiometric form, $Si_3N_4$.

FIG. 1 is a partial simplified cross-section view of an optoelectronic device 10 formed from nanowires or microwires such as previously described and capable of emitting an electromagnetic radiation.

Device 10 comprises, from bottom to top in FIG. 1:

a first biasing electrode 12;

a substrate 14, for example, semiconductor, comprising parallel surfaces 16 and 18, surface 16 being in contact with electrode 12; and surface 18 may be treated to promote the growth of nanowires or microwires in one of the many ways known in the art;

microwires or nanowires (three microwires or nanowires being shown) of height $H_1$, each microwires or nanowires comprising a lower portion 22 of height $H_2$, in contact with the substrate, and an upper portion 24 of height $H_3$;

an insulating layer 23 covering the periphery of each lower portion 22; and an active layer 26 covering each upper portion 24 and a second electrode layer 27 covering each active layer 26.

Substrate 14 for example is a semiconductor substrate, such as a silicon substrate. Substrate 14 may be doped with a first conductivity type, for example, type N.

Electrode 12 may correspond to a conductive layer which extends on surface 16 of substrate 14. The material forming electrode 12 may be, for example, nickel silicide (NiSi), aluminum (Al), or titanium (Ti).

Each microwire or nanowire 22-24 is a semiconductor structure elongated in the direction substantially perpendicular to surface 18. Each microwire or nanowire 22-24 may have a generally elongated cylindrical shape with a hexagonal base. The average diameter of each microwire or nanowire 22-24 may be in the range from 50 nm to 2.5 µm and height $H_1$ of each microwire or nanowire 22-24 may be in the range from 1 µm to 50 µm.

Lower portion 22 of each microwire or nanowire is mainly formed of a III-N compound, for example, gallium nitride, for example, doped with silicon. The periphery of lower portion 22 is covered with dielectric layer 23, for example SiN, up to a height $H_2$. Height $H_2$ may be in the range from 500 nm to 25 µm. Dielectric material layer 23 has a thickness in the range from one atomic monolayer to 10 nm.

Upper portion 24 of each microwire or nanowire is for example at least partly made of a III-N compound, for example, gallium nitride. Upper portion 24 may be doped with the first conductivity type, for example, type N, or may be undoped.

In the case of a microwire or nanowire mainly made of GaN, the crystal structure of the microwire or nanowire may be of wurtzite type, the microwire or nanowire extending along axis C.

Active layer 26 is the layer from which most of the radiation provided by device 10 is emitted or where most of the radiation captured by the device is captured. Active layer 26 may comprise confinement means, such as multiple quantum wells. It is for example formed of an alternation of GaN and of InGaN layers having respective thicknesses from 5 to 20 nm (for example, 8 nm) and from 1 to 10 nm (for example, 2.5 nm).

Between active layer 26 and electrode layer 27, it is possible to provide interface layers, not shown, that is, an electron barrier layer made of aluminum gallium nitride (AlGaN) having a conductivity type opposite to that of the GaN of the active layer, and an additional layer for improving the electric contact, for example, heavily-doped gallium nitride (GaN), for example, of type P, and which is called p++GaN.

Second electrode 27 is capable of ensuring the electric biasing of each portion and of letting through the electromagnetic radiation emitted or received by the device. The material forming electrode 27 may be a semitransparent material such as indium tin oxide (ITO), or aluminum zinc oxide.

As an example of forming of lower portion 22 of the microwires or nanowires, in the case where this lower portion is made of silicon-doped GaN, a MOCVD-type method may be implemented by injection into a MOCVD reactor, of shower type, of a gallium precursor gas, for example, trimethylgallium (TMGa) and a nitrogen precursor gas, for example, ammonia ($NH_3$). As an example, a showerhead-type 3×2" MOCVD reactor commercialized by AIXTRON, may be used. A molecular flow ratio between trimethylgallium and ammonia within the 5-200 range, preferably within the 10-100 range, enables to promote the growth of microwires and nanowires. As an example, a carrier gas which ensures the diffusion of metal-organic elements all the way into the reactor charges with metal-organic elements in a TMGa bubbler. The latter is adjusted according to the standard operating conditions. A flow of 60 sccm (standard cubic centimeters per minute) is for example selected for TMGa, while a 300-sccm flow is used for $NH_3$ (standard $NH_3$ bottle). A pressure of approximately 800 mbar (800 hPa) is used. Further, silane is injected into the MOCVD reactor, as a precursor material for silicon. The silane may be diluted in hydrogen at 1,000 ppm and a 20-sccm flow is provided. The temperature in the reactor is for example in the range from 950° C. to 1,100° C., preferably from 990° C. to 1,060° C. To transport species from the outlet of the bubblers to the two reactor plenums, a 2,000-sccm flow of carrier gas, for example, $N_2$, distributed between the two plenums, is used. For the growth of upper portion 24 of each microwire or nanowire up to height $H_3$, the previously-described operating conditions of the MOCVD reactor are, as an example, maintained but for the fact that the silane flow in the reactor is decreased, for example, by a factor greater than or equal to 10, or stopped.

The deposition of active layer 26 is performed so that it only occurs on upper portion 24 of the nanowire and not on lower portion 22 covered with dielectric layer 23. Similarly, the layer or the assembly of layers of electrode 27 only deposits on active layer 26 and not on dielectric 23.

The device described in FIG. 1 operates properly but has various disadvantages, particularly due to the fact that the emission or the reception associated with the portions of radial active layers is partially shielded by the presence of the neighboring microwires or nanowires.

Further, it is sometime desired to form devices having a wide spectrum of emission or reception wavelengths.

Figure 2:
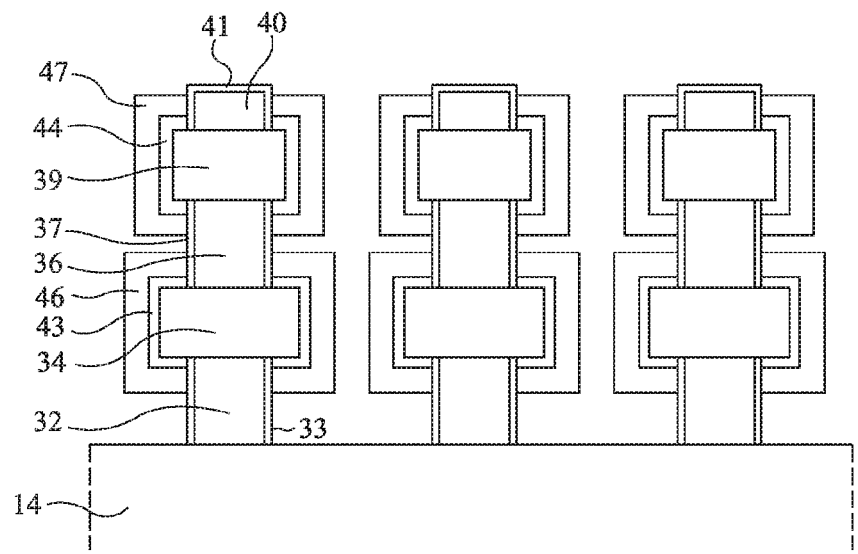
FIG. 2 is a partial simplified cross-section view of an embodiment of an optoelectronic device with microwires or nanowires.

FIG. 2 shows an embodiment of an optoelectronic device overcoming the above-mentioned disadvantages, and which may in particular have a wide emission or reception spectrum, and having a better quality of upward emission or reception. This device is devised from a microwire or nanowire comprising an alternation of insulated portions and of active portions, the various active portions having different diameters.

The device of FIG. 2 comprises a microwire or nanowire formed of successive portions:

a lower insulated portion 32, covered with an insulating layer 33, similar to previously-described lower portion 22, 23, for example, made of $n^+GaN$;

a portion 34, called "active portion" having a diameter greater than that of lower insulated portion 32;

a second insulated portion 36, covered with an insulating layer 37, similar to lower portion 32;

a new active portion 39 having a diameter greater than that of second insulated portion 36, and preferably smaller than that of active portion 34; and again an insulated portion 40, covered with a dielectric layer 41, similar to lower portion 32, 33.

Active portions 34, 39 are coated with active layers, respectively 43, 44, themselves covered with an electrode structure 46, 47.

Due to the different diameters of active portions 34, 39, the depositions of active layers are performed according to different thicknesses and/or proportions of materials. Particularly, in the case where the active layers comprise a quantum layer structure comprising an alternation of GaN and of InGaN layers, the proportion of indium is modified when the deposition is performed on structures having different diameters.

As result, the emission wavelengths associated with active layers 43 formed on active portion 34 will be different from those of active layers 44 formed on active portion 39. For example, in the case of active layers based on multiple quantum wells comprising an alternation of InGaN layers and of GaN layers, the active layer formed on portion 34, of a diameter of approximately 2.5 µm, emits at a 440-nm wavelength (in blue) while the active layer formed on portion 39, of a 1.5-µm diameter, emits at a higher wavelength, for example, 520 nm. A device having wide-band emission or reception properties can thus be obtained. In particular, the obtained emission or reception spectrum may be characteristic of white light. As compared with an optoelectronic device comprising microwires or nanowires emitting blue light and a phosphor-based layer absorbing part of the blue light and emitting yellow light, so that the general emission spectrum of the optoelectronic device is close to that of white light, the optoelectronic device according to the present embodiment requires no phosphor layer to provide white light.

Further, if the diameter of lower active portion 34 is greater than the diameter of upper active portion 39, it should be understood that the upward emission or the reception of light coming from above will be improved as compared with the case of the structure of FIG. 1.

Various methods may be used to form active portions 34, 39 of GaN microwires or nanowires having diameters different from that of insulated $n^+GaN$ portions 32, 36 on which they are formed. For this purpose, if insulated portions 32, 36 are formed by the above-described method, operating parameters of the reactor are modified to form active microwire or nanowire portions 34, 39. According to an embodiment, the pressure is modified and/or the relative composition of the precursors of group-III elements and of the precursors of group-V elements is modified. More specifically, a decrease of the pressure in the reactor on forming of an active portion with respect to the pressure used to form the underlying insulated portion causes an increase in the diameter of the active portion with respect to the underlying insulated portion. Further, an increase in the ratio of the group-V element precursor gas flow to the group-III element precursor gas flow with respect to the ratio used to form the underlying insulated portion causes an increase in the diameter of the active portion with respect to the underlying insulated portion.

It should be noted that if the parameter variation is abrupt, there is an abrupt diameter step. However, if this parameter variation is progressive, there may exist an intermediate conical area between the portions of microwires or nanowires of different diameter. The intermediate area is formed of semi-polar planes. According to an embodiment, each nanowire or microwire may comprise an active portion between two insulated portions corresponding to a conical portion with inclined sides.

As an example, the height of each of portions 32, 34, 36, 39, and 40 is in the range from 2 to 6 µm and the diameter of each of the portions is:

for insulated portions 32, 36, and 40: diameter from 100 nm to 2.5 µm, for example, 1 µm. These portions are formed with a relatively high pressure in the reactor, for example, 800 mbar (0.08 MPa);

for active portion 34: diameter from 150 to 4 µm, for example, 2.5 µm. This portion may be formed by decreasing the pressure to a value smaller than 800 mbar, for example, 200 mbar (0.02 MPa);

for active portion 39: diameter smaller than (or possibly equal to) that of portion 34, and thus in the range from 150 nm to 4 µm, for example, 1.75 µm. In this case, the pressure in the reactor should be between those used for portion 34 and portions 32, 36, 40, for example, a value of 400 mbars.

It should be noted that, in the embodiment of FIG. 2, the thicknesses of the assembly of the active layer and of the electrode layer and the distances between the portions of microwires or nanowires 34, 39 are such that electrode layers 46 and 47 do not join, so that the corresponding active layers can be biased differently. This only corresponds to an embodiment of the described device.

FIG. 3 shows a variation where the various dimensions are selected so that electrode layers 46 and 47 form a single electrode 50 so that a same biasing can be applied to all the active layers of the device. Further, in the embodiment of FIG. 3, no upper insulated portion corresponding to insulated portion 40 of FIG. 2 has been shown. This results in a favored upward emission. Active layers horizontally deposited on microwires or nanowires are known to have an emission/reception wavelength different from that of radial active layers. This may contribute, if desired, to increasing the operating wavelength spectrum of the device. Further, when the microwires or nanowires are sufficiently close to one another, electrodes 50 may at least partly join at the level of the active portions closest to the support.

Further, two active portions capable of being coated with active layers and with electrode layers have been shown in FIGS. 2 and 3. This number of regions may be multiplied.

FIG. 5 shows another embodiment of an optoelectronic device 50. Device 50 is formed from wires 52 of axis D, each comprising an alternation of insulated portions and of active portions, the active portions being covered with the active layer, at least one of the active portions comprising at least two portions of constant cross-section and of different diameters and/or at least one portion of constant cross-section and one portion with inclined sides.

As an example, device 50 comprises all the elements of the device shown in FIG. 2 except that active portion 34 is replaced with an active portion 54 and that active portion 39 is replaced with an active portion 55.

Active portion 54 successively comprises a portion 56 having a constant cross-section, a portion 58 having sides inclined with respect to axis D and with a cross-section which decreases from bottom to top, a portion 60 of constant cross-section having a diameter smaller than the diameter of portion 56, and a portion 62 with sides which are more inclined than portion 58 and with a cross-section which decreases from bottom to top.

Active portion 55 successively comprises a portion 64 of constant cross-section having a diameter smaller than the diameter of portion 60, a portion 66 with sides which are more inclined than portion 62 and with a cross-section which decreases from bottom to top, and a portion 68 of constant cross-section having a diameter smaller than the diameter of portion 64.

In the case where portions 54, 55 are mainly formed of GaN of N polarity, the wire growth is performed along axis −c. As an example, the lateral sides of portions 56, 60, 64, and 68 correspond to (1-100) crystal planes, said to be non-polar, parallel to axis D. The inclined sides of portions 58, 62, 66 correspond to semi-polar crystal planes having their angles of inclination relative to axis D of wire 52 depending on the wire growth conditions. As an example, the inclined sides of portion 58 correspond to (30-3-1) crystal planes inclined by approximately 10° relative to axis D. The inclined sides of portion 62 correspond to (20-2-1) crystal planes inclined by approximately 15° relative to axis D. The inclined sides of portion 66 correspond to (11-2-2) crystal planes inclined by approximately 32° relative to axis D. Of course, the inclined sides may correspond to other crystallographic planes, for example, crystallographic planes (1-10-1) or (1-101). Further, portion 68 comprises, at the top of the wire, a surface perpendicular to the axis of the wire, which corresponds to a polar plane −c.

As an example, the dimensions of each of portions 56, 58, 60, 62, 64, 66, 68 are:
  for portion 56, diameter: 2 μm-height: 1 μm;
  for portion 58, height: 1 μm;
  for portion 60, diameter: 1.6 μm-height: 1 μm;
  for portion 62, height: 1 μm;
  for portion 64, diameter: 1.14 μm-height: 1 μm;
  for portion 66, height: 500 nm;
  for portion 68, diameter: 500 nm-height: 500 nm.

Portions 56, 58, 60, 62 are coated with an active layer 70, itself coated with an electrode structure 72. Portions 64, 66, 68 are coated with an active layer 74, itself coated with an electrode structure 75. Insulated portion 36 is not covered with an active layer.

As previously described for active layers 43, 44, active layers 70, 74 may comprise confinement means, such as multiple quantum wells. Electrode layers 72, 75 may have the same composition as previously-described electrode layers 46, 47.

Active layer 70 successively comprises, from bottom to top, regions 76, 78, 80, 82 which respectively follow the shapes of portions 56, 58, 60, 62 that they cover and active layer 74 successively comprises, from bottom to top, regions 84, 86, 88 which respectively follow the shapes of portions 64, 66, 68.

In particular, regions 76, 80, 84, and 88 are regions with straight sides and regions 78, 82, and 86 are regions with inclined sides corresponding to crystal planes having inclinations substantially identical to the inclinations of portions 58, 62, and 66 respectively covered with regions 78, 82, and 86.

FIG. 5 shows an enlarged view of a portion of optoelectronic device 50 according to an embodiment, according to which active layer 70 comprises a quantum well structure comprising an alternation of GaN layers 90 and of InGaN layers 92, two InGaN layers 92 and three GaN layers 90 being shown in FIG. 5.

Due to the alternation of regions with inclined sides and of regions of constant cross-section, each active layer 70, 74 comprises a succession of regions having different thicknesses or proportions of materials. Particularly, in the case where each active layer 70, 74 comprises at least one InGaN layer, the proportion of indium is modified when the deposition is performed on structures with straight sides or on structures with sides of variable inclination. Further, the thicknesses of the InGaN and GaN layers are different when these layers are formed on structures with straight sides or on structures with sides of variable inclination. Indeed, the growth speed, on structures having sides of variable inclination, of the layers forming the quantum wells, as well as the incorporation of indium into these same wells, is different according to the different diameters of the regions of constant cross-section and to the different inclinations of the regions with inclined sides.

As a result, the emission wavelengths associated with each region with straight sides or with inclined sides of active layer 50 are different. Further, the different height-vs.-diameter proportions of the regions of each active layer may also be modified according to the targeted wavelengths and to the wavelengths which are desired to be combined. A device having wide band emission or reception properties can thus be obtained. In particular, the obtained emission or reception spectrum may be characteristic of white light. As compared with an optoelectronic device comprising wires emitting blue light and a phosphor-based layer absorbing part of the blue light and emitting yellow light, so that the general emission spectrum of the optoelectronic device is close to that of white light, the optoelectronic device according to the present embodiment requires no phosphor layer to provide white light.

As an example, in the case where each active layer 70, 74 comprises multiple quantum wells and is formed of an alternation of GaN layers having a thickness varying around 8 nm and of InGaN layers having a thickness varying around 2.5 nm, the emission wavelengths of the regions of active layers 70, 74 are the following:
  region 76: 440 nm;
  region 78: 480 nm;
  region 80: 520 nm;
  region 82: 510 nm;
  region 84: 540 nm;
  region 86: 490 nm; and
  region 88: 560 nm.

Further, if the diameter of active portion 56 is greater than the diameter of active portion 60, itself greater than the diameter of active portion 64, itself greater than the diameter of active portion 68, it should be understood that the upward emission or the reception of light coming from above will be improved as compared with the case of optoelectronic device 10 of FIG. 1.

The device manufacturing method comprises growing portion 54 by successively forming portions 56, 58, 60, 62 and growing portion 55 by successively forming portions 64, 66, 68. The ratio of the molecular flow of the precursor of the group-V element to the molecular flow of the precursor of the group-III element is called V/III ratio hereafter. As an example, each portion with straight sides is obtained by maintaining ratio V/III at a given value within a range of V/III ratios from among a plurality of different ranges of V/III ratios. Further, each portion with inclined sides is obtained by applying a variation rate, or gradient, to the V/III ratio at a given value in a range of variation rates from among a plurality of different ranges of variation rates. As an example, for portions with inclined sides having their cross-section decreasing from bottom to top, the obtaining of the inclined sides is obtained by a negative variation rate of the V/III ratio, for example achieved by an increase of the molecular flow of the precursor of the group-III element. For each range of variation rates of the V/III ratio, a different inclination of the inclined sides is obtained.

According to another example, each portion with straight sides is obtained by maintaining a constant pressure in the reactor in a pressure range from among a plurality of different pressure ranges. Further, each portion with inclined sides is obtained by applying a variation rate, or gradient, to the pressure in the reactor at a given value in a range of variation rates from among a plurality of different ranges of variation rates. For each range of variation rates of the pressure, a different inclination of the inclined sides is obtained.

According to another example, each portion with straight sides is obtained by maintaining both the V/III ratio constant and the pressure constant in the reactor. Further, each portion with inclined sides is obtained by applying a gradient to the V/III ratio and a gradient to the pressure in the reactor.

As an example, to form portion 56, the previously-described operating conditions of the MOCVD reactor are maintained, but for the fact that the silane flow in the reactor is decreased, for example, by a factor 10, or stopped. The V/III ratio is then substantially constant at a first value. To form the next portion with inclined sides 58, a first negative gradient is applied to the V/III ratio of the first value of V/III ratio until a second value of the V/III ratio is reached. To form the next portion with straight sides 60, the V/III ratio is maintained at the second value. To form the next portion with inclined sides 62, a second negative gradient is applied to the V/III ratio of the second value of V/III ratio until a third value of the V/III ratio is reached.

According to a variation of optoelectronic device 50, active portion 54 or 55 may comprise first and second portions having substantially constant cross-sections and different diameters connected by a step, that is, by a surface substantially perpendicular to the wire axis, the first and second portions being covered with the active layer.

According to an embodiment, the active portions are covered with a GaN layer before the forming of the actual active layer. The GaN layer has a thickness greater than 10 nm, preferably greater than 20 nm, more preferably greater than 40 nm. The GaN layers follows the shape of the straight lateral sides of the wires, while however, each time a step is crossed, forming semi-polar planes having an inclination depending on the width of the step.

The inventors have shown that, on forming of the active layer by epitaxy on each active portion, each sub-layer of the active layer comprises regions which grow according to non-polar planes on at least a portion of the lateral sides of the portions of constant cross-section and regions which grow according to semi-polar planes at the level of each transition between adjacent portions of constant cross-section. The inclination of the regions with inclined sides particularly depends on the difference between the diameters of two successive portions of constant cross-section. Preferably, each step has a depth smaller than or equal to 100 nm.

An embodiment of the manufacturing method of this variation corresponds to the method previously described for the manufacturing of device 50, except that the growth parameters are changed according to a step between two successive active portions of constant cross-section and of different diameters. As an example, the V/III ratio passes, stepwise, from an initial constant value to a final constant value, between two successive active portions of constant cross-section and of different diameters.

According to another variation of optoelectronic device 50, active portion 54 or 55 comprises at least one first portion of constant cross-section extending in a second portion with inclined sides having its cross-section increasing as the distance to the substrate increases, the first and second portions being covered with the active layer.

Further, embodiments where the microwires or nanowires, covered with a first electrode, are formed on a first surface of a support while a second electrode is formed on a second surface of the support, opposite to the first surface, have been shown in the drawings. It should however be clear that the second electrode may be provided on the side of the first surface.

Further, although, in the previously-described embodiments, each microwire or nanowire comprises a passivated portion 32 at the base of the microwire or nanowire in contact with surface 18, passivated portion 32 may be absent.

Further, although the previously-described embodiments relate to III-V compounds, what has been described may also be implemented for the manufacturing of II-VI compounds (for example, zinc oxide ZnO) comprising a semiconductor material mainly comprising a group-II element and a group-VI element.

Although various embodiments of a wide-band optoelectronic device have been described, it should be understood that each element of these various embodiments may be combined differently with the other elements.

The invention claimed is:

1. An optoelectronic device comprising microwires or nanowires, each of which comprises at least one active portion between two insulated portions, the at least one active portion being surrounded with an active layer capable of emitting or capturing light, the at least one active portion having inclined sides or comprising at least a portion having a diameter different from a diameter of at least one of the two insulated portions;
    wherein the at least one active portion comprises at least one first portion extending in a second portion, the at least one first portion being the closest of the at least one first portion and the second portion to a support of the microwires or nanowires, and
    wherein one of the at least one first portion and the second portion has inclined sides and further has a cross-section which increases as the distance to the support of the microwires or nanowires increases.

2. The device of claim 1, wherein a portion of the active layer surrounding the at least one first portion and another portion of the active layer surrounding the second portion are capable of emitting or capturing light at different wavelengths.

3. The device of claim 1, wherein each microwire or nanowire comprises a third portion continuing the second portion, the third portion having straight sides or inclined sides.

4. The device of claim 1, wherein the insulated portions and the at least one active portion mainly comprise a III-V compound.

5. The device of claim 4, wherein the III-V compound is a III-N compound, selected from the group consisting of: gallium nitride, aluminum nitride, indium nitride, indium gallium nitride, aluminum gallium nitride, and indium aluminum gallium nitride.

6. The device of claim 1, wherein each insulated portion is surrounded with a layer of dielectric material having a thickness in the range from one atomic monolayer to 10 nm.

7. The device of claim 1, wherein the total height of the at least one active portion of each microwire or nanowire is greater than or equal to 500 nm.

8. The device of claim 1, wherein a portion most distant from the support is an insulated portion.

9. An optoelectronic device comprising microwires or nanowires, each of which comprises at least one active portion between two insulated portions, the at least one active portion being surrounded with an active layer capable of emitting or capturing light, the at least one active portion having inclined sides or comprising at least a portion having a diameter different from a diameter of at least one of the two insulated portions;
  wherein each of the microwires or nanowires further comprises an alternation of insulated portions and of active portions, each active portion having inclined sides or comprising at least a portion having a diameter different from the diameter of at least one of the two insulated portions.

10. The device of claim 9, comprising an alternation of insulated portions and of active portions, the active portions having different diameters.

11. The device of claim 9, wherein each active layer is surrounded with an electrode layer.

12. The device of claim 9, wherein at least two active portions have sides oriented along different crystal planes.

13. The device of claim 9, wherein the active layers surrounding at least two active portions are capable of emitting or capturing light at different wavelengths.

14. The device of claim 9, wherein each active layer comprises a multiple quantum well structure.

15. A method of manufacturing an optoelectronic device comprising microwires or nanowires, each of which comprises at least one active portion between two insulated portions, the at least one active portion being surrounded with an active layer capable of emitting or capturing light, the at least one active portion having inclined sides or comprising at least a portion having a diameter different from a diameter of at least one of the two insulated portions,
  wherein the insulated portions are formed in a reactor with first proportions of precursors of III-V compounds and a dopant such as silicon, and wherein the at least one active portion is formed in the same reactor in different operating conditions and with a dopant rate smaller than that of the insulated portions or equal to zero.

16. The method of claim 15, wherein the at least one active portion is formed with lower operating pressures than the insulated portions.

17. The method of claim 15, wherein the at least one active portion is formed with proportions of precursor of the III-V compounds different from those of the insulated portions.

18. The method of claim 15, wherein the at least one active portion comprises a first portion extending in a second portion, the first portion being the closest to the support of the microwires or nanowires, the first and second portions having straight sides and different diameters, the first and second portions having inclined sides with different inclinations, the first portion having inclined sides and the second portion having straight sides, or the first portion having straight sides and the second portion having inclined sides, wherein the first portion is formed in a reactor with first operating conditions of the reactor, and wherein the second portion is formed in the same reactor with operating conditions different from the first operating conditions.

19. The method of claim 18, wherein the first and second portions mainly comprise a III-V compound and wherein the first or the second portion is formed by increasing or decreasing the ratio of proportions of precursors of the III-V compounds with a variation rate which is constant to within 10%.

20. The method of claim 18, wherein the first and second portions mainly comprise a III-V compound and wherein the first portion is formed with a first ratio of proportions of precursors of the III-V compounds at a first value constant to within 10% and wherein the second portion is formed with a second ratio of proportions of the precursors of the III-V compounds constant to within 10% and different from the first ratio.

21. The method of claim 18, wherein the first or the second portion is formed by increasing or decreasing the pressure in the reactor with a variation rate constant to within 10%.

22. The method of claim 18, wherein the first portion is formed with a first pressure in the reactor which is constant to within 10% and wherein the second portion is formed with a second pressure in the reactor which is constant to within 10% and different from the first pressure.

* * * * *